(12) United States Patent
Han

(10) Patent No.: US 7,732,245 B2
(45) Date of Patent: Jun. 8, 2010

(54) PHOTODIODE OF CMOS IMAGE SENSOR AND METHOD FOR MANUFACTURING THE SAME

(75) Inventor: Chang Hun Han, Icheon (KR)

(73) Assignee: Dongbu Electronics Co., Ltd., Seoul (KR)

(*) Notice: Subject to any disclaimer, the term of this patent is extended or adjusted under 35 U.S.C. 154(b) by 277 days.

(21) Appl. No.: 11/319,591

(22) Filed: Dec. 29, 2005

(65) Prior Publication Data
US 2006/0145209 A1    Jul. 6, 2006

(30) Foreign Application Priority Data
Dec. 30, 2004    (KR) .................. 10-2004-0116422

(51) Int. Cl.
*H01L 21/00* (2006.01)
(52) U.S. Cl. .................. 438/73; 257/225; 257/292; 257/E27.133
(58) Field of Classification Search .................. 257/59, 257/290–292, E27.133; 438/199, 200
See application file for complete search history.

(56) References Cited

U.S. PATENT DOCUMENTS

| | | | | |
|---|---|---|---|---|
| 6,204,524 B1 * | 3/2001 | Rhodes | ............... | 257/222 |
| 6,277,698 B1 * | 8/2001 | Ishida et al. | ............... | 438/299 |
| 6,528,342 B2 * | 3/2003 | Miyagawa et al. | ............... | 438/79 |
| 6,639,261 B2 * | 10/2003 | Rhodes | ............... | 257/291 |
| 6,677,656 B2 * | 1/2004 | François | ............... | 257/462 |
| 6,846,722 B2 * | 1/2005 | Lee | ............... | 438/449 |
| 7,015,521 B2 * | 3/2006 | Koyama | ............... | 257/292 |
| 7,199,405 B2 * | 4/2007 | Rhodes | ............... | 257/184 |
| 7,214,974 B2 * | 5/2007 | Shin | ............... | 257/225 |
| 7,227,199 B2 * | 6/2007 | Hwang | ............... | 257/184 |
| 7,271,430 B2 * | 9/2007 | Park et al. | ............... | 257/225 |
| 7,358,108 B2 * | 4/2008 | Han et al. | ............... | 438/60 |

(Continued)

FOREIGN PATENT DOCUMENTS

KR    10-2004-0008912 A    1/2004

(Continued)

OTHER PUBLICATIONS

Lenoble ("Plasma Doping as an Alternative Route for Ultra-Shallow Junction Integration to Standard CMOS Technologies", Semiconductor Fabtech, 16th edition, Published Mar. 1, 2002).*

*Primary Examiner*—Lex Malsawma
*Assistant Examiner*—William F Kraig
(74) *Attorney, Agent, or Firm*—McKenna Long & Aldridge LLP

(57) ABSTRACT

A photodiode of a CMOS image sensor and a method for manufacturing the same are provided, in which ions implanted in the vicinity of a device isolation film are prevented from being diffused into a photodiode region to reduce a dark current. The photodiode of a CMOS image sensor includes a heavily doped P-type semiconductor substrate, a lightly doped P-type epitaxial layer formed on the semiconductor substrate, a gate electrode formed on the epitaxial layer, a device isolation film and an N-type photodiode region formed in the epitaxial layer, an insulating film formed on the epitaxial layer to open a portion between the device isolation film and the photodiode region, and a heavily doped P-type diffusion region formed in the epitaxial layer between the device isolation film and the photodiode region.

4 Claims, 5 Drawing Sheets

U.S. PATENT DOCUMENTS

2003/0096443 A1* 5/2003 Hwang .................. 438/59
2003/0230771 A1* 12/2003 Lee ...................... 257/226
2003/0234432 A1* 12/2003 Song et al. ............. 257/440
2004/0033667 A1 2/2004 Lee
2004/0251398 A1* 12/2004 Mouli et al. ............ 250/214.1

FOREIGN PATENT DOCUMENTS

KR 10-20040058697 A 7/2004

* cited by examiner

PHOTODIODE OF CMOS IMAGE SENSOR AND METHOD FOR MANUFACTURING THE SAME

This application claims the benefit of Korean Patent Application No. 10-2004-0116422, filed on Dec. 30, 2004, which is hereby incorporated by reference for all purposes as if fully set forth herein.

BACKGROUND OF THE INVENTION

1. Field of the Invention

The present invention relates to a complementary metal-oxide semiconductor (CMOS) image sensor and a method for manufacturing the same, and more particularly, to a CMOS image sensor and a method for manufacturing the same in which ions implanted in the vicinity of a device isolation film are prevented from being diffused into a photodiode region to reduce a dark current.

2. Discussion of the Related Art

An image sensor is a semiconductor device that converts optical images to electrical signals. The image sensor is classified into a charge coupled device (CCD) and a CMOS image sensor. The CCD stores charge carriers in MOS capacitors and transfers the charge carriers to the MOS capacitors. The MOS capacitors are approximate to one another. The CMOS image sensor employs a switching mode that sequentially detects outputs of unit pixels using MOS transistors by forming the MOS transistors to correspond to the number of the unit pixels using CMOS technology that uses a control circuit and a signal processing circuit as peripheral circuits.

The CMOS image sensor that converts data of an object into electrical signals includes signal processing chips having photodiodes. Each of the signal processing chips includes an amplifier, an analog-to-digital converter, an internal voltage generator, a timing generator, and a digital logic. Thus, it is economical in view of space, power consumption, and cost. The manufacture of the CCD requires technical process steps. However, the CMOS image sensor can be manufactured in mass production by a simple silicon wafer etching process cheaper than that used in the manufacture of the CCD. Also, the CMOS image sensor has an advantage in its packing density.

To display images, the CMOS image sensor sequentially detects signals in a switching mode by forming a photodiode and a transistor in a unit pixel. Also, since the CMOS image sensor uses CMOS technology, low power consumption is required. Furthermore, the number of masks required is less than the number of masks required for the CCD. For example, the number of masks for a CMOS image sensor is fewer by twenty than the thirty to forty masks required for the CCD. In this way, in the CMOS image sensor, process steps are simplified and various signal processing circuits can be integrated in one chip. Therefore, the CMOS image sensor has received much attention as an image sensor for the next generation.

FIG. 1 illustrates a unit circuit of a related art CMOS image sensor. The unit circuit of the CMOS image sensor according to a related art includes a photodiode and three MOS transistors. That is, the unit circuit of the CMOS image sensor includes a photodiode 1 generating optical charges using received light, a reset transistor 2 resetting the optical charges generated by the photodiode 1, a drive transistor 3 serving as a source-follower buffer amplifier, and a selection transistor 4 serving as an addresser.

As shown in FIG. 2, a P-type epitaxial layer (P-EPI) 11 is grown on a heavily doped P-type substrate 10, and a device isolation film 12 is formed in the epitaxial layer 11. The device isolation film 12 serves to isolate a lightly doped N-type photodiode region 16 from a device. A gate insulating film 14 and a gate electrode 15 of a transfer transistor are formed on the epitaxial layer 11. A heavily doped P-type diffusion region 13 is formed at both sides of the device isolation film 12 to prevent the occurrence of a dark current.

However, in the CMOS image sensor manufactured above, the dark current does occur. The dark current deteriorates performance of the image sensor and charges. The dark current is generated, even in case of no light, by electrons moving from a photodiode to a floating diffusion region. The dark current is caused by various defects, such as a line defect, a point defect, or dangling bond, occurring in the vicinity of a surface of a semiconductor substrate, between a device isolation film and a epitaxial layer, between a device isolation film and a photodiode, or in a P-type region and an N-type region. The dark current may cause a serious problem under a low illumination condition.

To reduce the dark current occurring in the vicinity of the surface of the semiconductor substrate, tilt ion implantation is performed in the lightly doped P-type epitaxial layer 11, the lightly doped N-type region 16, the heavily doped P-type substrate 10, and the device isolation film 12. However, in this case, impurity ions are excessively diffused into the photodiode region 16 by additional thermal diffusion performed when a well is formed.

SUMMARY OF THE INVENTION

Accordingly, the present invention is directed to a photodiode of a CMOS image sensor and a method for manufacturing the same that substantially obviates one or more problems due to limitations and disadvantages of the related art.

An advantage of the present invention is to provide a photodiode of a CMOS image sensor and a method for manufacturing the same, which reduces dark current by preventing ions implanted in the vicinity of a device isolation film from being diffused into a photodiode region.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, there is provided a photodiode of a CMOS image sensor comprising a heavily doped P-type semiconductor substrate, a lightly doped P-type epitaxial layer formed on the semiconductor substrate, a gate electrode formed on the epitaxial layer, a device isolation film and an N-type photodiode region formed in the epitaxial layer, an insulating film formed on the epitaxial layer to open a portion between the device isolation film and the photodiode region, and a heavily doped P-type diffusion region formed in the epitaxial layer between the device isolation film and the photodiode region.

In another aspect of the present invention, there is provided a method for manufacturing a photodiode of a CMOS image sensor. The method comprises forming a device isolation film on a semiconductor substrate, forming a photodiode region on the semiconductor substrate, forming a first insulating film on the semiconductor substrate including the photodiode region, patterning the first insulating film to open a portion between the device isolation film and the photodiode region and a region for a gate electrode, forming a diffusion region on the semiconductor substrate between the device isolation film and the photodiode region, and forming the gate electrode on the semiconductor substrate.

In other aspect of the present invention, there is provided a method for manufacturing a photodiode of a CMOS image sensor. The method comprises forming a lightly doped P-type epitaxial layer on a heavily doped P-type semiconductor substrate, forming a device isolation film and an N-type photodiode region in the epitaxial layer, forming a first insulating film on the semiconductor substrate including the photodiode region, patterning the first insulating film to open a portion between the device isolation film and the photodiode region and a region for a gate electrode, forming a heavily doped P-type diffusion region in the epitaxial layer between the device isolation film and the photodiode region, and forming the gate electrode on the epitaxial layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings. Wherever possible, like reference designations will be used throughout the drawings to refer to the same or similar parts.

Figure 1:
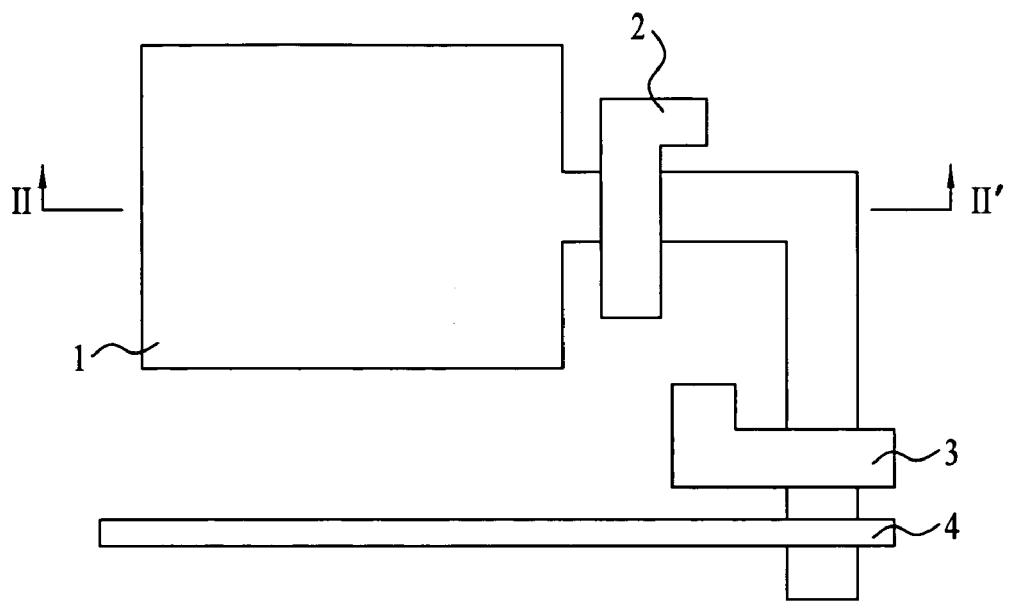
FIG. 1 is a plan view of a unit circuit of a CMOS image sensor of a related art.
Figure 2:
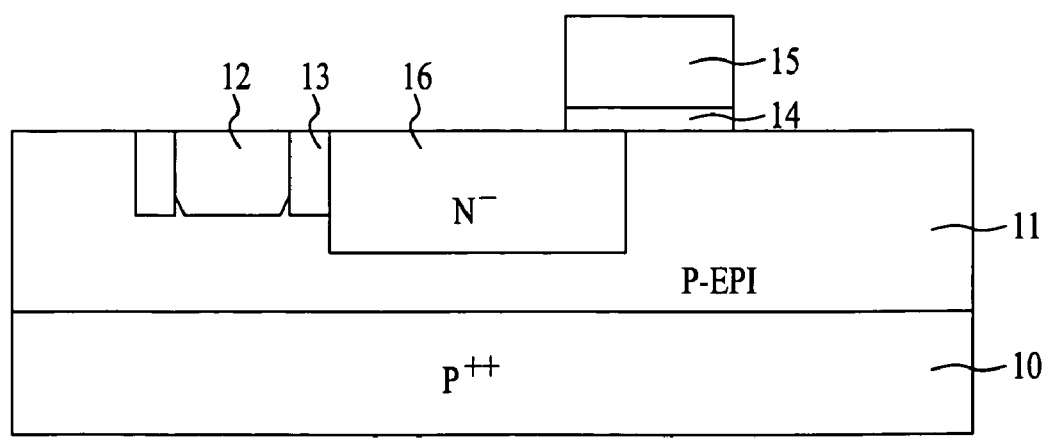
FIG. 2 is a sectional view taken along line II-II' shown in FIG. 1.
Figure 3:
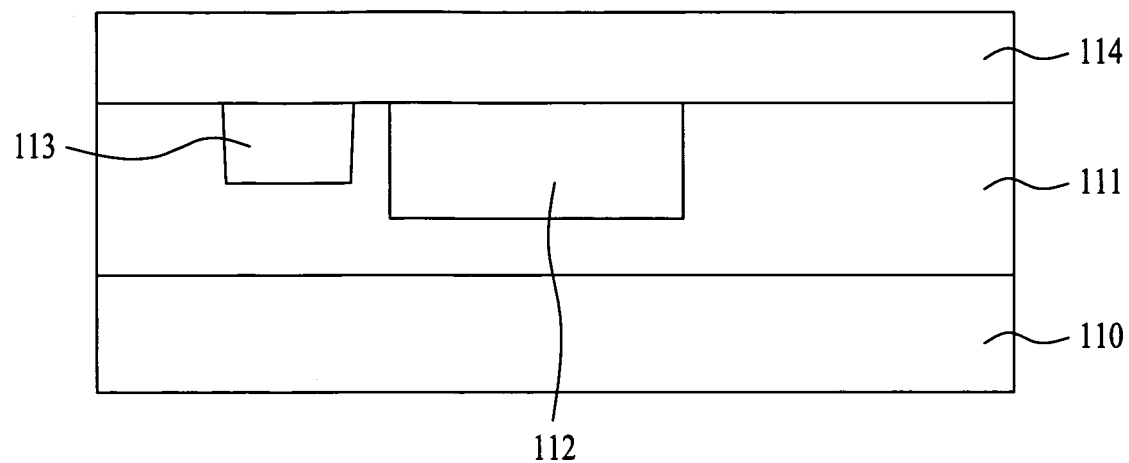
FIGS. 3-10 are sectional views of a photodiode of a CMOS image sensor according to the present invention, illustrating a method for fabricating the photodiode.

Referring to FIG. 3, a P-type epitaxial layer 111 is grown on a heavily doped P-type substrate 110, and a device isolation film 113 is formed in the epitaxial layer 111. The device isolation film 113 serves to isolate a lightly doped N-type photodiode region 112 from a device. A first insulating film 114 is formed on the epitaxial layer 111 including the device isolation film 113 and the photodiode region 112.

Figure 4:
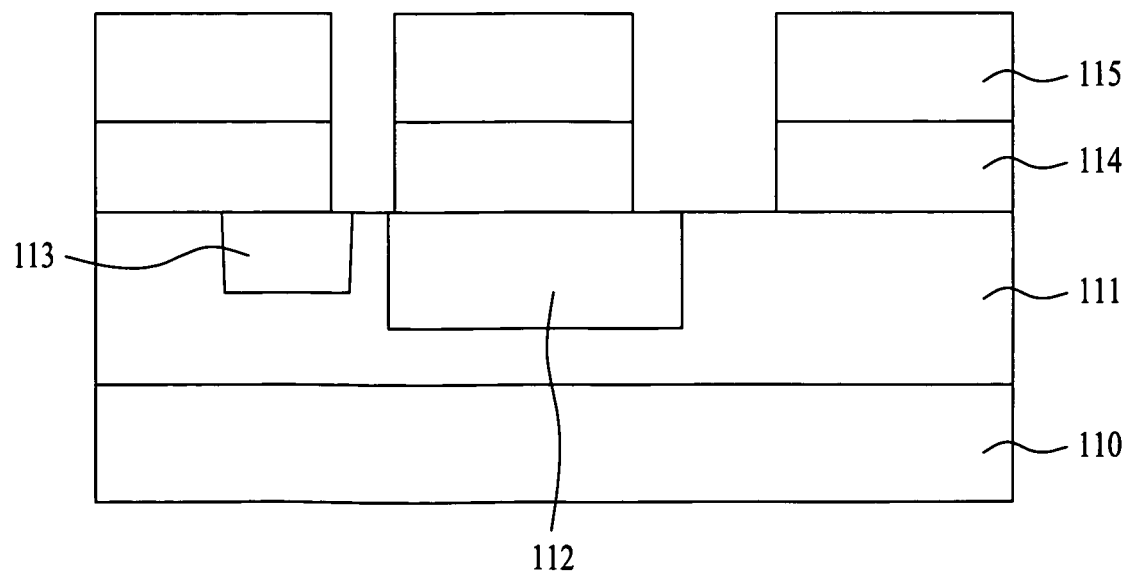

Referring to FIG. 4, a first photoresist film is deposited on the first insulating film 114 and then undergoes exposing and developing processes to form a first photoresist film pattern 115. The first photoresist film pattern 115 serves to open a portion between the device isolation film 113 and the photodiode region 112. The first insulating film 114 is selectively etched using the first photoresist film pattern 115 as a mask.

Figure 5:
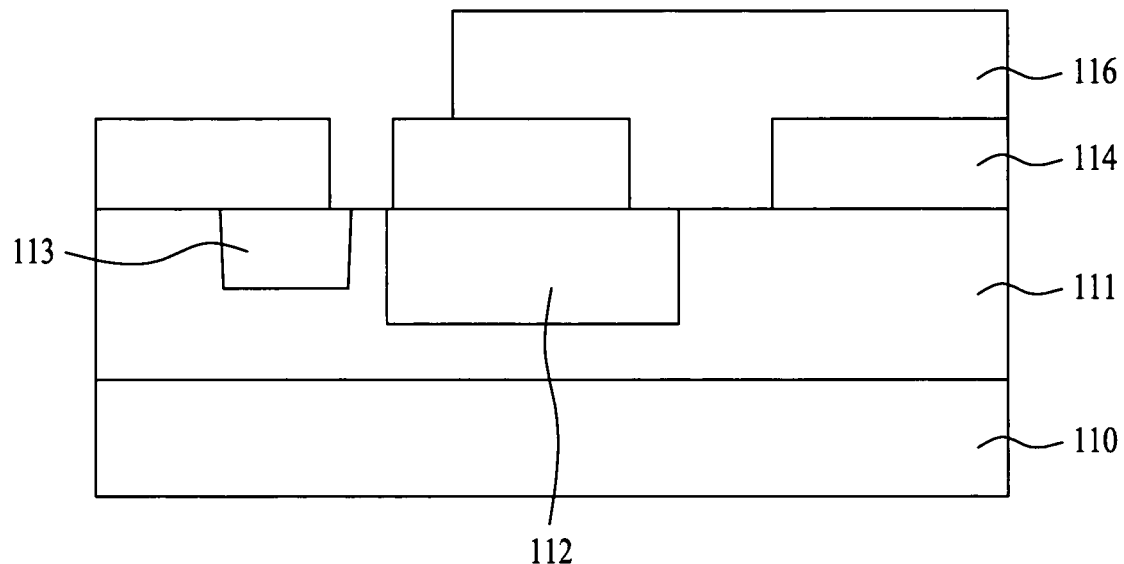

Referring to FIG. 5, the first photoresist film pattern 115 is removed, and a second photoresist film is deposited on the first insulating film 114. The second photoresist film undergoes exposing and developing processes to form a second photoresist film pattern 116 that covers a gate formation region.

Figure 6:
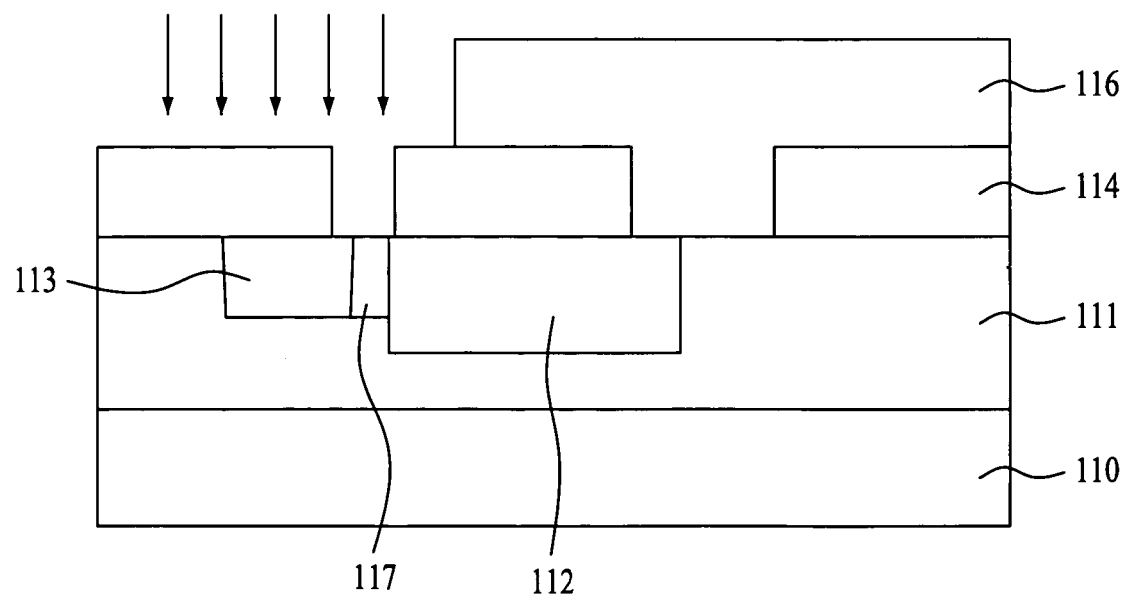

Referring to FIG. 6, a heavily doped P-type diffusion region 117 is formed by implanting P-type ions such as B or BF$_2$ into the portion between the device isolation film 113 and the photodiode region 112 using the second photoresist film pattern 116 as a mask.

Figure 7:
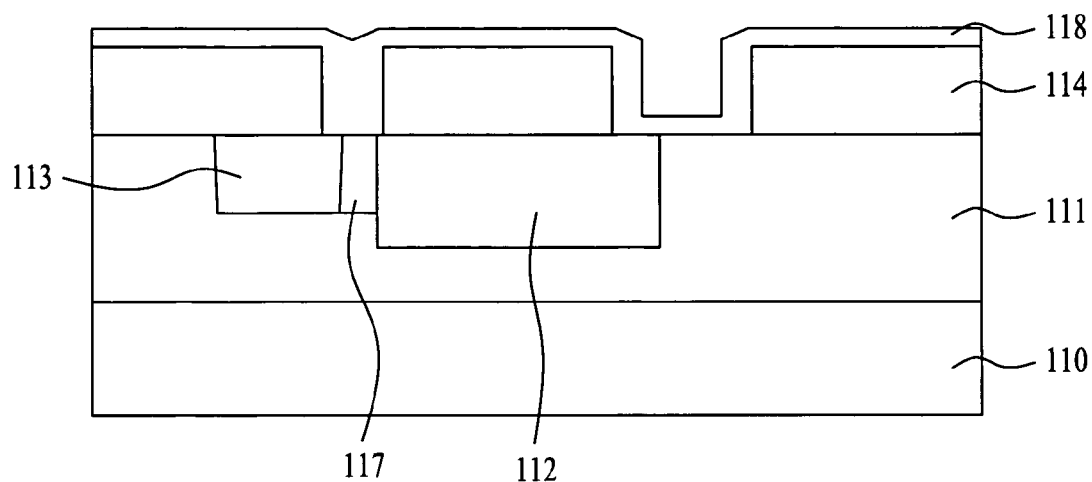

Referring to FIG. 7, the second photoresist film pattern 116 is removed, and a second insulating film 118 is formed on the epitaxial layer 111 including the first insulating film 114.

Figure 8:
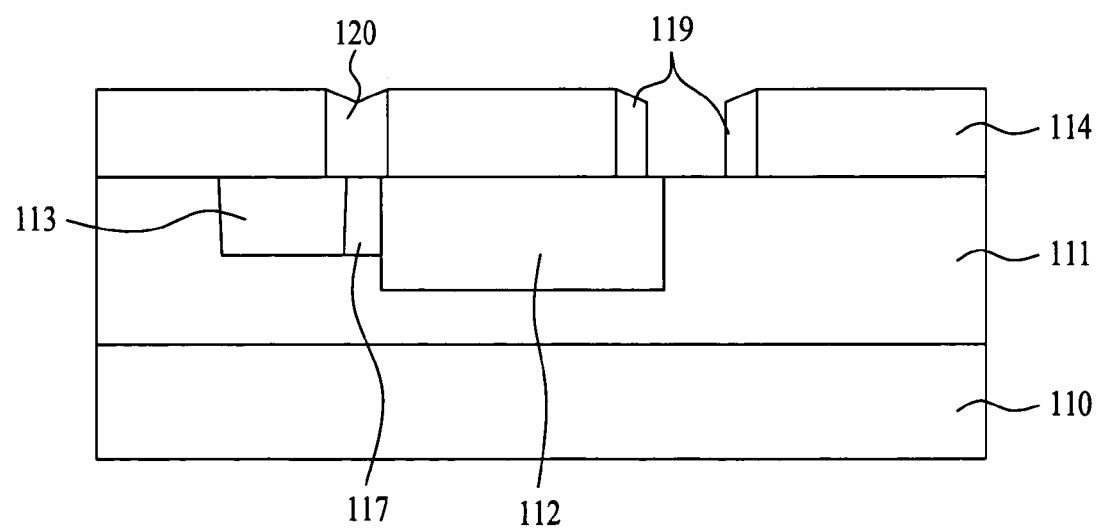

Referring to FIG. 8, the second insulating film 118 is etched by anisotropic etching until the upper surface of the first insulating film 114 is exposed. Then, an etch-back process is performed on the second insulating film 118 and a spacer 119 is formed at the inner sides of the gate formation region. The gate formation region has a greater width than the region between the device isolation film 113 and the photodiode region 112, where a buried layer 120 is formed.

Figure 9:
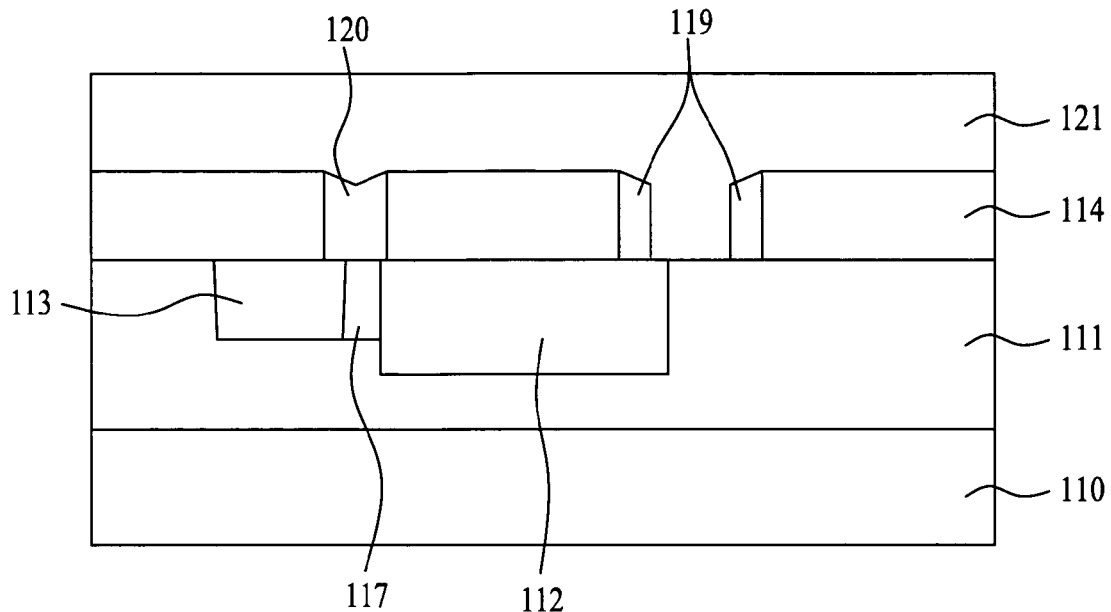

As shown in FIG. 9, a polysilicon layer 121 is deposited on the epitaxial layer 111 including the first insulating film 114.

Figure 10:
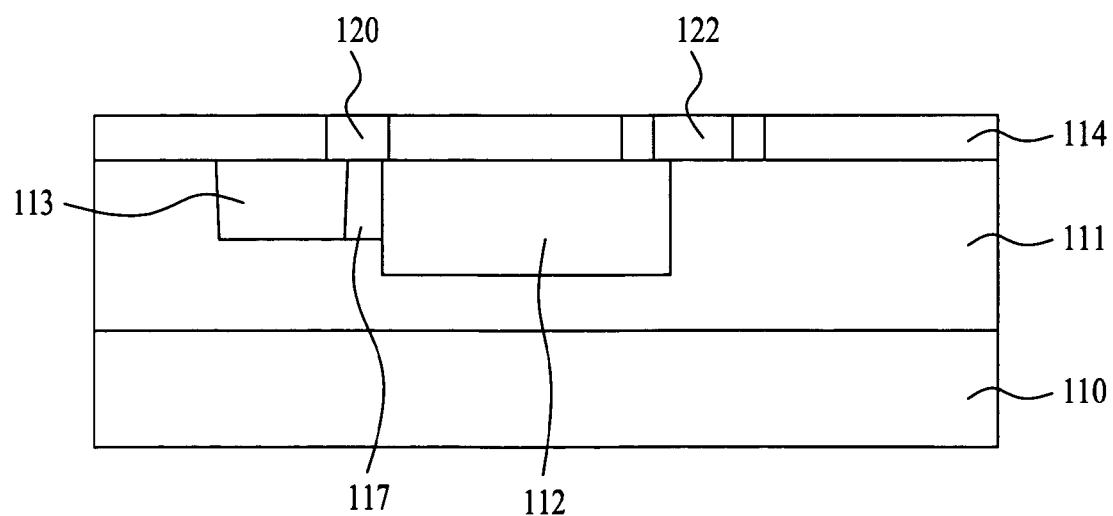

As shown in FIG. 10, the polysilicon layer 121 is polished by a chemical mechanical polishing process until the surface of the first insulating film 114 is exposed. Thus, a gate electrode 122 is formed.

In the CMOS image sensor manufactured above, the heavily doped P-type ions are only implanted into the region between the device isolation film 113 and the photodiode region 112. This reduces dark current by preventing impurity ions from being diffused into the photodiode region due to additional thermal diffusion performed when a well is formed. With dark current thus reduced, device characteristics between pixels can uniformly be obtained to improve characteristics of the image sensor. Also, since the thermal diffusion is minimized, it is possible to densely control the interval between pixels, thereby improving packing density.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a photodiode of a CMOS image sensor comprising:

forming a lightly doped epitaxial layer on a semiconductor substrate;

forming a device isolation film on the semiconductor substrate;

forming a photodiode region on the semiconductor substrate;

forming a first insulating film on the lightly doped epitaxial layer including the photodiode region;

patterning the first insulating film to open a portion of the lightly doped epitaxial layer between the device isolation film and the photodiode region, and to open another portion of the lightly doped epitaxial layer for a gate formation region;

forming a photoresist film on the first insulating film to cover the gate formation region on the lightly doped epitaxial layer;

forming a diffusion region only in the opened portion of the lightly doped epitaxial layer between a sidewall of the device isolation film and a sidewall of the photodiode region using the photoresist film pattern and patterned first insulating film as a mask; and forming a gate electrode on the lightly doped epitaxial layer and inside the gate formation region.

2. The method of claim 1, further comprising:

depositing a polysilicon layer on the semiconductor substrate including the first insulating film; and polishing the polysilicon layer using chemical mechanical polishing.

3. A method for manufacturing a photodiode of a CMOS image sensor comprising:

forming a lightly doped P-type epitaxial layer on a heavily doped P-type semiconductor substrate;

forming a device isolation film and an N-type photodiode region in a surface of the epitaxial layer;

forming a first insulating film on the lightly doped P-type epitaxial layer including the photodiode region;

patterning the first insulating film to open a portion of the lightly doped P-type epitaxial layer between the device isolation film and the photodiode region, and to open another portion of the lightly doped P-type epitaxial layer for a gate formation region;

forming a photoresist film pattern on the first insulating film to cover the gate formation region on the lightly doped P-type epitaxial layer;

forming a heavily doped P-type diffusion region only in the opened portion of the lightly doped P-type epitaxial layer between a sidewall of the device isolation film and a sidewall of the photodiode region by implanting P-type ions into the opened portion of the lightly doped P-type epitaxial layer using the photoresist film pattern and the patterned first insulating film as a mask;

removing the photoresist pattern; and forming a gate electrode on the lightly doped P-type epitaxial layer and inside the gate formation region.

4. The method of claim 3, further comprising:

depositing a polysilicon layer on the epitaxial layer including the first insulating film; and polishing the polysilicon layer using chemical mechanical polishing.

* * * * *